(12) United States Patent
Wang et al.

(10) Patent No.: US 8,486,754 B1
(45) Date of Patent: Jul. 16, 2013

(54) METHOD FOR MANUFACTURING A GATE-CONTROL DIODE SEMICONDUCTOR DEVICE

(75) Inventors: Pengfei Wang, Shanghai (CN); Chengwei Cao, Shanghai (CN); Qingqing Sun, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/534,983

(22) Filed: Jun. 27, 2012

(30) Foreign Application Priority Data

Jan. 5, 2012 (CN) .......................... 2012 1 0001675

(51) Int. Cl.
*H01L 21/00* (2006.01)
(52) U.S. Cl.
USPC .............................. 438/104; 438/85; 438/151
(58) Field of Classification Search
USPC .................... 438/85, 104, 149, 151, 154
See application file for complete search history.

(56) References Cited

U.S. PATENT DOCUMENTS

| | | | | |
|---|---|---|---|---|
| 5,838,707 A | * | 11/1998 | Ramdani et al. | ................ 438/22 |
| 6,410,162 B1 | * | 6/2002 | White et al. | .................. 428/642 |
| 7,824,957 B2 | * | 11/2010 | Umeda et al. | ................ 438/104 |

* cited by examiner

*Primary Examiner* — Kevin M Picardat
(74) *Attorney, Agent, or Firm* — Jenkins, Wilson, Taylor & Hunt, P.A.

(57) ABSTRACT

This invention belongs to semiconductor device manufacturing field and discloses a method for manufacturing a gate-control diode semiconductor device. When the gate voltage is relatively high, the channel under the gate has an n type and the device has a simple gate-control pn junction structure; by way of controlling the effective n-type concentration of the ZnO film through back-gate control, inverting the n-type ZnO into p-type through the gate and using NiO as a p-type semiconductor, an n-p-n-p doping structure is formed. The present invention features capacity of manufacturing gate-control diode devices able to reduce the chip power consumption through the advantages of a high driving current and small sub-threshold swing, is especially applicable to the manufacturing of reading & writing devices having flat panel displays & phase change memory, and semiconductor devices based on flexible substrates.

7 Claims, 5 Drawing Sheets

METHOD FOR MANUFACTURING A GATE-CONTROL DIODE SEMICONDUCTOR DEVICE

CROSS-REFERENCE TO RELATED APPLICATION

This application claims priority to Chinese Patent Application No. CN 201210001675.9 filed on Jan. 5, 2012, the entire content of which is incorporated by reference herein.

BACKGROUND OF THE INVENTION

1. Technical Field

The present invention belongs to the technical field of semiconductor device manufacturing, relates to a method for manufacturing a semiconductor device, and more especially, to a method for manufacturing a gate-control diode semiconductor device.

2. Description of Related Art

The Metal-Oxide-Semiconductor Field Effect Transistor (MOSFET) is a kind of field effect transistor capable of being widely used in the analog circuits and digital circuits, of which the basic structure is as shown in FIG. 1, including a silicon substrate 101, a gate insulation layer 104 and a gate conductive layer 105 formed on the silicon substrate 101, wherein a drain region 102 and a source region 103 are arranged on both sides of the gate in the substrate 101. When a large enough potential difference is applied between the gate and the source of the MOSFET, the electric field will form induced charges on the surface of the silicon substrate under the gate insulation layer, thus a so-called "inversion channel" is formed. The channel polarity is the same as that of the drain and source. Assume that the drain and the source are of n type, the channel is also of n type. After the formation of the channel, the MOSFET can allow the current to pass through it. The current values passing through the channel of the MOSFET will vary with the voltage values applied on the gate due to its control.

With the continuous development of integrated circuits, the size of the MOSFET becomes smaller and smaller, and the transistor density on unit array becomes higher and higher. Today, the technology node of integrated circuit devices is about 45 nm and the leakage current between the source and the drain of the MOSFET is increasing rapidly with the decrease of channel length. Moreover, the minimum sub-threshold swing (SS) of the traditional MOSFET is limited to 60 mv/dec, which restricts the opening and closing speed of the transistor. On some chips of high integration density, the reduction of the device size means greater SS value. However, the high-speed chips require a smaller SS value to improve the device frequency as well as reduce the chip power consumption. Therefore, when the channel length of the device decreases to less than 30 nm, a new-type of device shall be used to obtain a smaller leakage current and SS value, thus decreasing the chip power consumption.

BRIEF SUMMARY OF THE INVENTION

In view of this, the present invention aims at providing a method for manufacturing a gate-control diode semiconductor device capable of reducing the leakage current and the SS value so as to reduce the chip power consumption.

The semiconductor device provided in the present invention adopts the positive feedback automatic gain principle. Namely, when the doping type of a planar semiconductor device is p-n-p-n, two pairs of interdependent triodes, p-n-p and n-p-n, are generated. Usually, both triodes can be magnified mutually, which may cause the increase of the device current and further cause the breakdown of the device in severe cases. To apply this characteristic into thin-film semiconductors, a gate-control diode semiconductor memory based on the ZnO semiconductor material is provided in the present invention. When the gate voltage is high and the channel under the gate has an n type, the device has a simple gate-control pn junction structure. By way of controlling the effective n type concentration of the ZnO film through back-gate control, inverting the n-type ZnO to p-type through the gate and using NiO as a p-type semiconductor, an n-p-n-p doping structure is formed.

A method for manufacturing the gate-control diode semiconductor memory device above is provided in the present invention, including the following steps:

provide a heavily-doped n-type silicon substrate;

form a first kind of insulation film on the n-type silicon substrate;

form a ZnO layer on the first kind of insulation film;

etch the ZnO layer to form an active region;

form a second kind of insulation film on the ZnO dielectric layer;

etch the second kind of insulation film to form a window located at one end of the ZnO active region;

coat the second kind of insulation film through spin coating with a layer of spin-coating dielectric of the first doping type which makes contact with the ZnO at the window of the second kind of insulation film;

form a doping region (namely a source region) of the first doping type at the window of the second kind of insulation film in the ZnO dielectric layer through the high-temperature diffusion process, wherein the other parts of the ZnO are not doped due to the barrier of the second kind of insulation film;

remove the residual spin-coating dielectric of the first doping type;

define a pattern through photoetching and etch the second kind of insulation film to define the position of a drain region and a channel region, wherein the drain region is on the opposite side to the source region on the ZnO and the channel region is between the source region and the drain region;

form a third kind of insulation film through deposition;

etch out the third kind of insulation film on the source region and the drain region to define the positions of the contact holes of the drain and the source;

form a first kind of conductive film through deposition and etch the first kind of conductive film to form a drain electrode, a gate electrode and a source electrode which are independent of one another, wherein the source electrode makes contact with the source region on one side of the floating gate region through the source contact hole, the drain electrode makes contact with the ZnO drain region on the other side of the floating gate region through the drain contact hole and the gate electrode cover the non-etched third kind of insulation film on the channel region.

Further, the method for manufacturing a gate-control diode semiconductor device, characterized in that the first kind of insulation film is of silicon oxide and with a thickness of 1-500 nm, the second kind of insulation film is of silicon oxide and silicon nitride, and the thickness of the ZnO dielectric layer is 1-100 nm.

Furthermore, the method for manufacturing a gate-control diode semiconductor device, characterized in that, the third kind of insulation film is of SiO2 or high dielectric constant materials such as HfO2, the first kind of conductive film is of heavily-doped polycrystalline silicon, copper, tungsten, aluminum, tantalium nitride or tantalum nitride, and the first doping type is p-type doping.

The method for manufacturing a gate-control diode semiconductor device provided in the present invention features a simple process, low manufacturing cost, and capacity of manufacturing gate-control diode devices able to reduce the chip power consumption through the advantages of high driving current and small sub-threshold swing, and is especially applicable to the manufacturing of semiconductor devices based on flexible substrate and reading & writing devices having flat panel display and phase change memory.

DETAILED DESCRIPTION OF THE INVENTION

Figure 1:
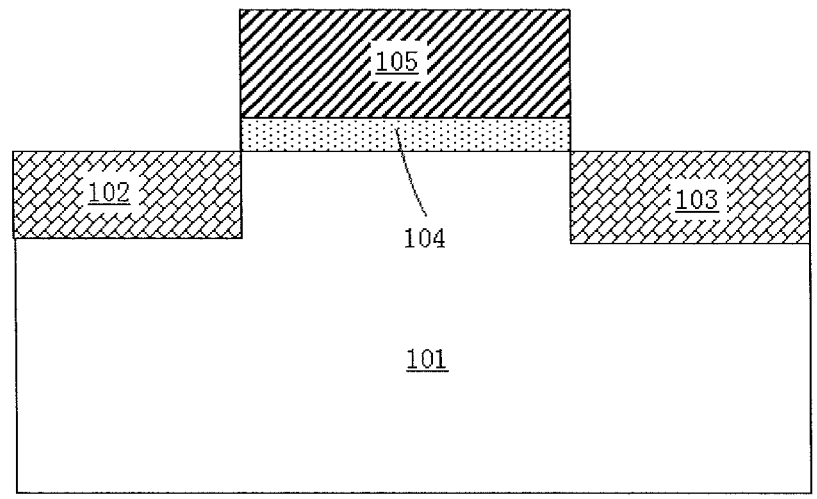
FIG. 1 is the sectional view of the traditional MOSFET.

An exemplary embodiment of the present invention is further detailed herein by referring to the drawings. In the drawings, the thicknesses of the layers and regions are either zoomed in or out for the convenience of description, so it shall not be considered as the true size. Although these drawings cannot accurately reflect the true size of the device, they still reflect the relative positions among the regions and composition structures completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "substrate" used in the following description can be considered as a semiconductor substrate during manufacturing process, and other film layers prepared on it may also be included.

Firstly, develop a silicon oxide film with a thickness of 20 nm on a provided silicon substrate 201 heavily doped with n-type impurity ions, then deposit a ZnO film 203 with a thickness of 10 nm on the silicon oxide film 202 through atomic layer deposition and form a silicon dioxide film 204 on the ZnO film 203 through spin coating.

Figure 2:
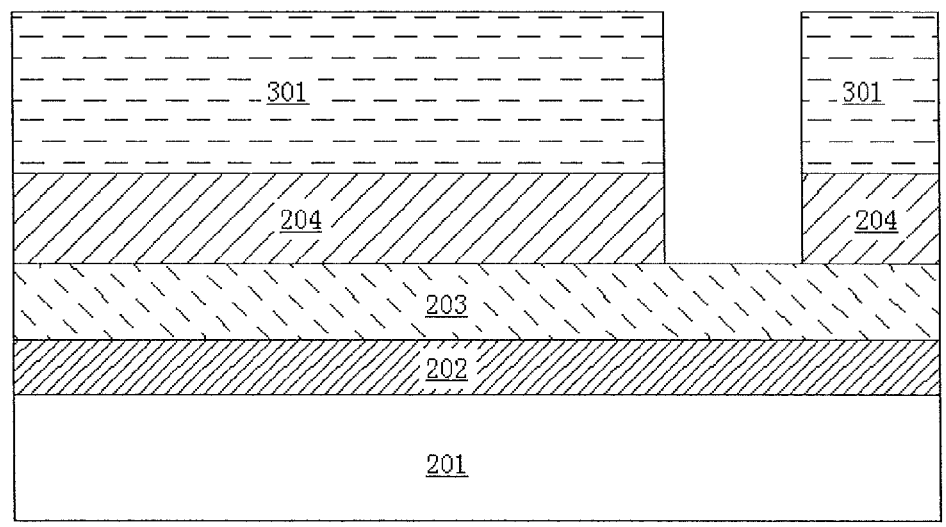
FIGS. 2-8 are the process flow diagrams of an embodiment of the method for manufacturing a gate-control diode semiconductor device disclosed in the present invention.

After forming a silicon dioxide film 204, deposit a layer of photoresist 301 and form a pattern through masking film, exposal and development, and etch the silicon dioxide film 204 to form a window, as shown in FIG. 2.

Figure 3:
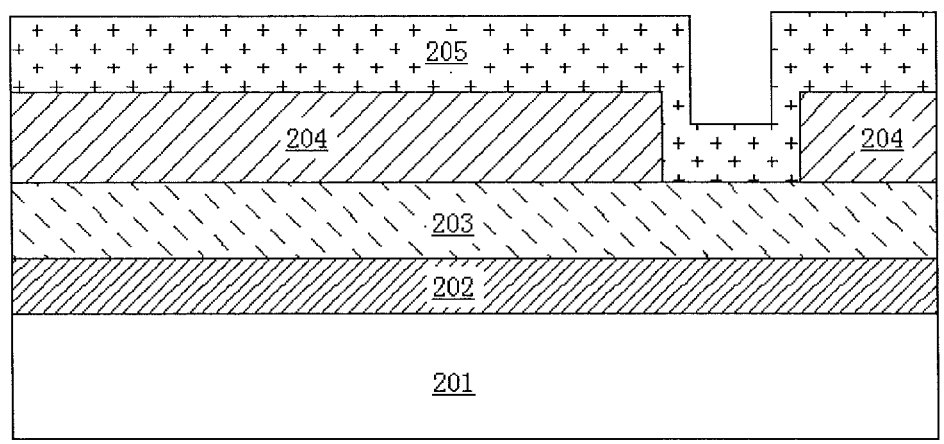
Figure 4:
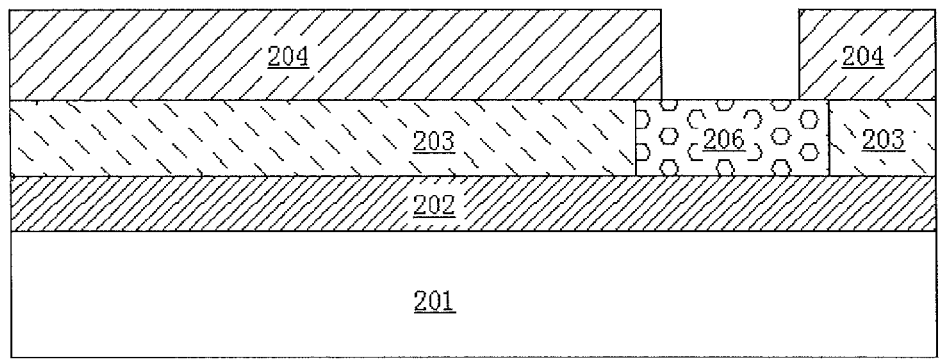

Next, remove the photoresist 301 and coat a layer of spin-coating dielectric 205 doped of p-type doping type (in the embodiment of the present invention, SOD-P507 is used) through spin coating, as shown in FIG. 3. Then form a p-type doping region 206 in the ZnO film 203 through the diffusion process and the construction after removing the spin-coating dielectric 205 is as shown in FIG. 4.

Figure 5:
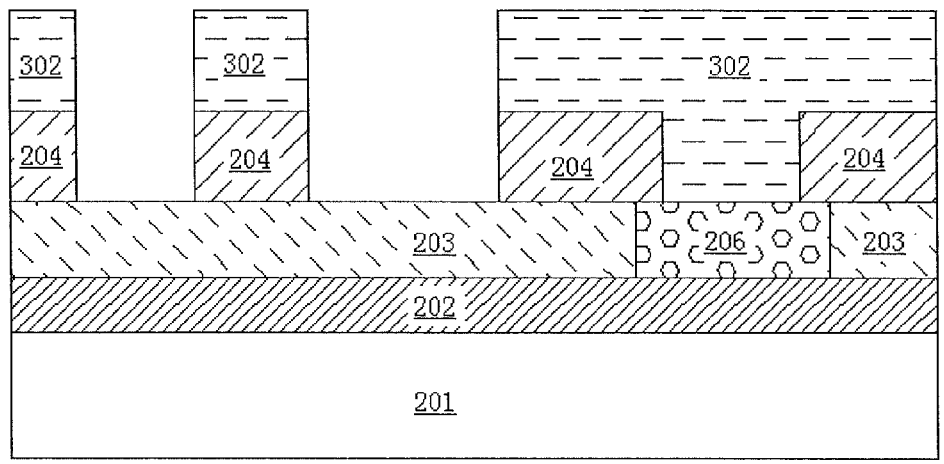

Next, deposit a layer of photoresist 302 and form a pattern through masking film, exposal and development, and etch the silicon dioxide film 204 to define the positions of the drain and the gate, as shown in FIG. 5.

Figure 6:
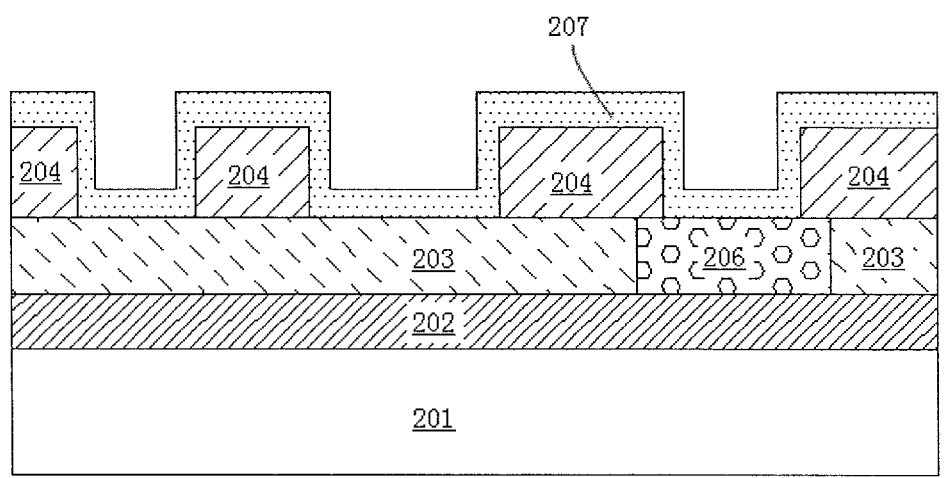
Figure 7:
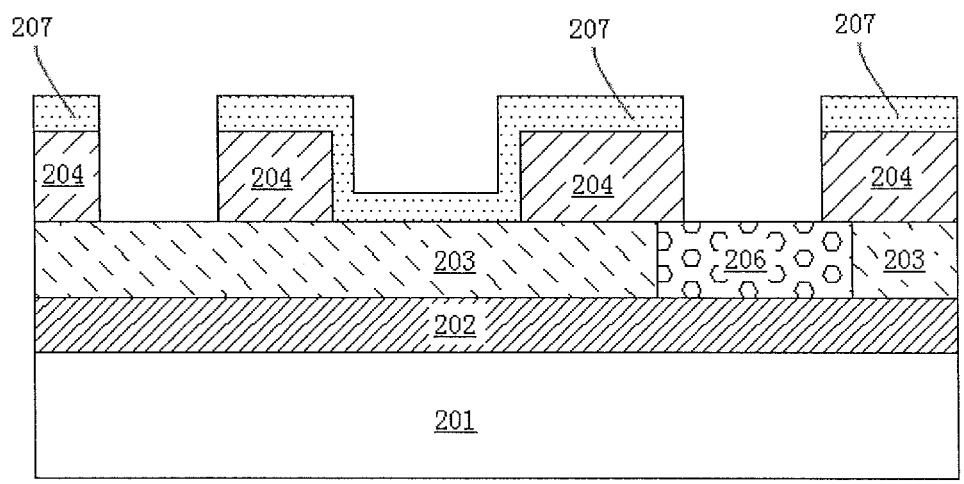

After removing the photoresist 302, deposit a layer of high dielectric constant material 207 such as $HfO_2$, as shown in FIG. 6. Next, deposit a layer of photoresist again and form a pattern through photoetching and then etch the high dielectric constant material 207 to define the positions of the drain and the source, as shown in FIG. 7.

Figure 8:
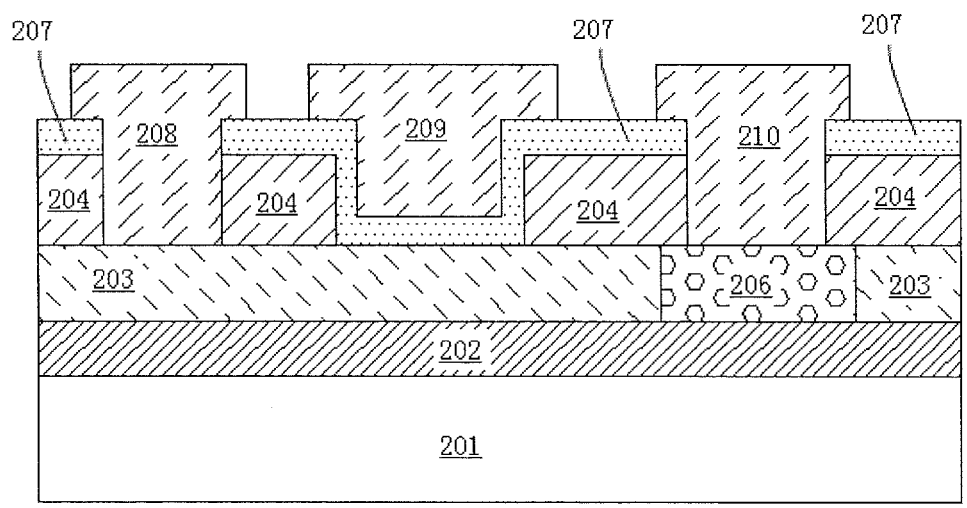

Finally, deposit a metal conductive film such as aluminum and then form a drain electrode 208, a gate electrode 209 and a source electrode 210 through photoetching and etching, as shown in FIG. 8.

Figure 9:
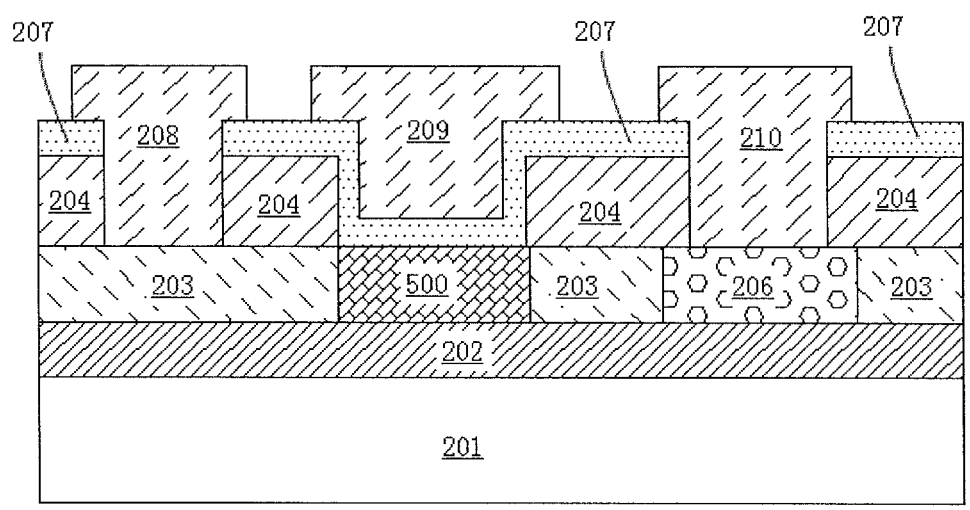
FIG. 9 is the schematic diagram of the structure of an embodiment in cut-off state of the gate-control diode device manufactured by using the method provided in the present invention.

Since ZnO has the characteristics of n-type semiconductors, when the source and drain are applied with a forward bias, the device structure is equivalent to a forward-biased $P^+N$ junction structure and the device is conductive if the gate is applied with a positive voltage. If the gate is applied with a negative voltage, a p-type region 500 is formed in the ZnO dielectric layer 203, as shown in FIG. 9, the device is equivalent to a p-n-p-n junction structure and is cut off.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for manufacturing a gate-control diode semiconductor device, characterized in that it includes the following steps:

provide a heavily-doped n-type silicon substrate;

form a first kind of insulation film on the n-type silicon substrate;

form a ZnO layer on the first kind of insulation film;

etch the ZnO layer to form an active region;

form a second kind of insulation film on the ZnO dielectric layer;

etch the second kind of insulation film to form a window located at one end of the ZnO active region;

coat the second kin d of insulation film through spin coating with a layer of spin-coating dielectric of the first doping type which makes contact with the ZnO at the window of the second kind of insulation film;

form a doping region (namely a source region) of the first doping type at the window of the second kind of insulation film in the ZnO dielectric layer through the high-temperature diffusion process, wherein the other parts of the ZnO are not doped due to the barrier of the second kind of insulation film;

remove the residual spin-coating dielectric of the first doping type;

define a pattern through photoetching and etch the second kind of insulation film to define the position of a drain region and a channel region, wherein the drain region is on the opposite side to the source region on the ZnO and the channel region is between the source region and the drain region;

form a third kind of insulation film through deposition;

etch out the third kind of insulation film on the source region and the drain region to define the positions of the contact holes of the drain and the source;

form a first kind of conductive film through deposition and etch the first kind of conductive film to form a drain electrode, a gate electrode and a source electrode which are independent of one another, wherein the source electrode makes contact with the source region on one side of the floating gate region through the source contact hole, the drain electrode makes contact with the ZnO drain region on the other side of the floating gate region through the drain contact hole and the gate electrode cover the non-etched third kind of insulation film on the channel region.

2. The method for manufacturing a gate-control diode semiconductor device according to claim 1, characterized in that the first kind of insulation film is of silicon oxide and with a thickness of 1-500 nm.

3. The method for manufacturing a gate-control diode semiconductor device according to claim 1, characterized in that the second kind of insulation film is of silicon oxide or silicon nitride.

4. The method for manufacturing a gate-control diode semiconductor device according to claim 1, characterized in that the thickness of the ZnO dielectric layer is 1-100 nm.

5. The method for manufacturing a gate-control diode semiconductor device according to claim 1, characterized in that the third kind of insulation film is of SiO2 or high dielectric constant material HfO2.

6. The method for manufacturing a gate-control diode semiconductor device according to claim 1, characterized in that the first kind of conductive film is of heavily-doped polycrystalline silicon, copper, tungsten, aluminum, titanium nitride or tantalum nitride.

7. The method for manufacturing a gate-control diode semiconductor memory device according to claim 1, characterized in that the first doping type is silicon p-type doping.

* * * * *